(12) United States Patent
Zemskov et al.

(10) Patent No.: US 10,877,115 B2
(45) Date of Patent: Dec. 29, 2020

(54) SYSTEMS AND METHODS FOR A RADIO FREQUENCY COIL FOR MR IMAGING

(71) Applicant: General Electric Company, Schenectady, NY (US)

(72) Inventors: Aleksey Zemskov, Solon, OH (US); Victor Taracila, Beachwood, OH (US); Fraser John Laing Robb, Aurora, OH (US)

(73) Assignee: General Electric Company, Schenectady, NY (US)

( * ) Notice: Subject to any disclaimer, the term of this patent is extended or adjusted under 35 U.S.C. 154(b) by 156 days.

(21) Appl. No.: 16/129,601

(22) Filed: Sep. 12, 2018

(65) Prior Publication Data
US 2020/0081080 A1    Mar. 12, 2020

(51) Int. Cl.
*G01R 33/34* (2006.01)
*G01R 33/341* (2006.01)
*G01R 33/36* (2006.01)
*G01R 33/385* (2006.01)

(52) U.S. Cl.
CPC ....... *G01R 33/3403* (2013.01); *G01R 33/341* (2013.01); *G01R 33/34084* (2013.01); *G01R 33/3614* (2013.01); *G01R 33/3621* (2013.01); *G01R 33/3642* (2013.01); *G01R 33/385* (2013.01)

(58) Field of Classification Search
CPC ............ G01R 33/3628; G01R 33/3415; G01R 33/3642; G01R 33/365; G01R 33/3614
See application file for complete search history.

(56) References Cited

U.S. PATENT DOCUMENTS

| | | | |
|---|---|---|---|
| 5,521,506 A * | 5/1996 | Misic ................... | G01R 33/365 324/318 |
| 2014/0167758 A1* | 6/2014 | Sambandamurthy .. | A61B 5/055 324/322 |
| 2017/0359034 A1* | 12/2017 | Hussein .................... | H03F 1/56 |
| 2018/0335491 A1* | 11/2018 | Yang ..................... | G01R 33/341 |
| 2018/0372817 A1* | 12/2018 | Rahmat-Samii ....... | A61B 5/055 |

FOREIGN PATENT DOCUMENTS

WO    2018098248 A1    5/2018

* cited by examiner

*Primary Examiner* — Alesa Allgood

(57) ABSTRACT

Various methods and systems are provided for a flexible, lightweight, and low-cost radio frequency (RF) coil of a magnetic resonance imaging (MM) system with reduced power dissipation during decoupling. In one example, the RF coil includes a loop portion with distributed capacitance which comprises two conductor wires encapsulated and separated by a dielectric material and a feed board including a decoupling circuit configured to decouple the distributed capacitance of the loop portion during a transmit operation, an impedance inverter circuit, and a pre-amplifier.

18 Claims, 6 Drawing Sheets

… … …

SYSTEMS AND METHODS FOR A RADIO FREQUENCY COIL FOR MR IMAGING

FIELD

Embodiments of the subject matter disclosed herein relate to magnetic resonance imaging (MM), and more particularly, to MM radio frequency (RF) coils.

BACKGROUND

Magnetic resonance imaging (MRI) is a medical imaging modality that can create images of the inside of a human body without using x-rays or other ionizing radiation. MM systems include a superconducting magnet to create a strong, uniform, static magnetic field $B_0$. When a human body, or part of a human body, is placed in the magnetic field $B_0$, the nuclear spins associated with the hydrogen nuclei in tissue water become polarized, wherein the magnetic moments associated with these spins become preferentially aligned along the direction of the magnetic field $B_0$, resulting in a small net tissue magnetization along that axis. MRI systems also include gradient coils that produce smaller amplitude, spatially-varying magnetic fields with orthogonal axes to spatially encode the magnetic resonance (MR) signal by creating a signature resonance frequency at each location in the body. The hydrogen nuclei are excited by a radio frequency signal at or near the resonance frequency of the hydrogen nuclei, which add energy to the nuclear spin system. As the nuclear spins relax back to their rest energy state, they release the absorbed energy in the form of an RF signal. This RF signal (or MR signal) is detected by one or more RF coils and is transformed into the image using reconstruction algorithms.

BRIEF DESCRIPTION

In one embodiment, an RF coil assembly for an MM system includes a loop portion with distributed capacitance which comprises two conductor wires encapsulated and separated by a dielectric material and a feed board including a decoupling circuit configured to decouple the distributed capacitance of the loop portion during a transmit operation, an impedance inverter circuit, and a pre-amplifier.

It should be understood that the brief description above is provided to introduce in simplified form a selection of concepts that are further described in the detailed description. It is not meant to identify key or essential features of the claimed subject matter, the scope of which is defined uniquely by the claims that follow the detailed description. Furthermore, the claimed subject matter is not limited to implementations that solve any disadvantages noted above or in any part of this disclosure.

BRIEF DESCRIPTION OF THE DRAWINGS

The present invention will be better understood from reading the following description of non-limiting embodiments, with reference to the attached drawings, wherein below.

DETAILED DESCRIPTION

Figure 6:
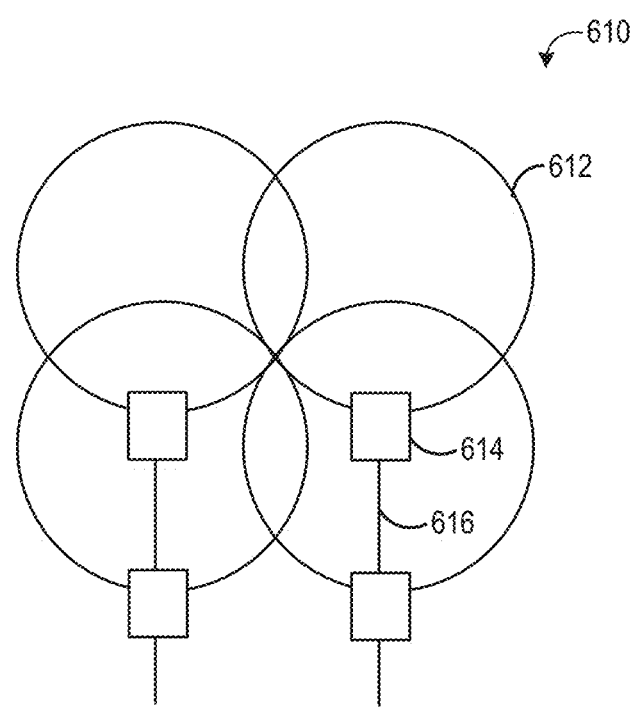
FIG. 6 schematically shows an example RF coil array.

The following description relates to various embodiments of a radio frequency (RF) coil in an MRI system. An MRI system, such as the MRI system shown by FIG. 1, includes a receive RF coil unit that may be comprised of one or more RF coils. For example, the receive RF coil unit may comprise an array of RF coils, as shown in FIG. 6. The RF coils are configured with coupling electronics and distributed capacitance wire conductors, as shown in FIG. 2, such that each RF coil is lightweight, flexible, and transparent to each other RF coil. In this way, the RF coils may be positioned against a body of a patient and wrapped around the patient in order to image portions of the body that include complicated geometries. Because the RF coils include the coupling electronics and distributed capacitance wire conductors, the RF coils may move and/or overlap relative to each other without degradation of MR signals transmitted to the MRI system by the RF coils.

The coupling electronics may be housed on a relatively small feed board coupled to the loop portion of the RF coil, such as approximately the size of 2 $cm^2$ or smaller. While the small feed board provides decreased weight and increased flexibility relative to other receive RF coils, the small feed board may be prone to high temperatures. For example, the components on the feed board may be heated to temperatures of 100° C. or greater. These high temperatures affect amplifier performance and the reliability of other components and/or require the use of heat spreaders, which may increase the bulkiness of the feed board.

Figure 3:
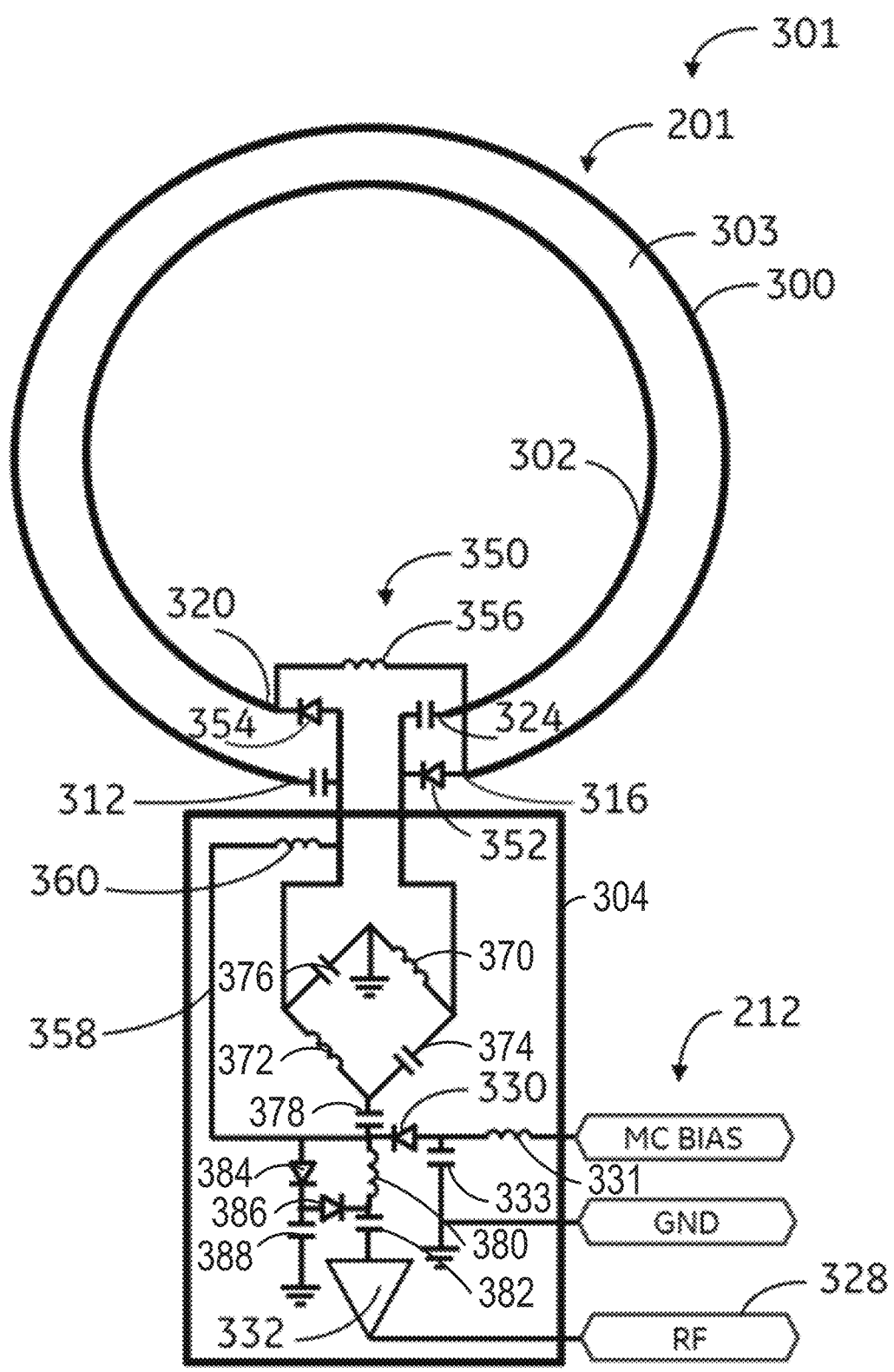
FIG. 3 schematically shows an example RF coil.

Thus, according to embodiments disclosed herein, the amount of heat generated at the feed board may be reduced by decoupling the capacitance of the loop portion from the feed board during periods where the RF coil is not used for signal reception, such as during a transmit RF pulse. When the capacitance of the loop is decoupled from the feed board, the loop becomes an inductor, which can decrease the current in the loop and add reactance to the RF coil. The reactance decreases $B_1$ field distortion and reduces Joule heating. The loop capacitance may be decoupled from the feed board by shorting the loop wires, as shown in FIG. 3. By shorting the wires during a transmit RF pulse, for example, the heat generated by the RF coil may be reduced, as measured by the test set-up illustrated in FIG. 4, the results of which are shown by the graph of FIG. 5.

Figure 1:
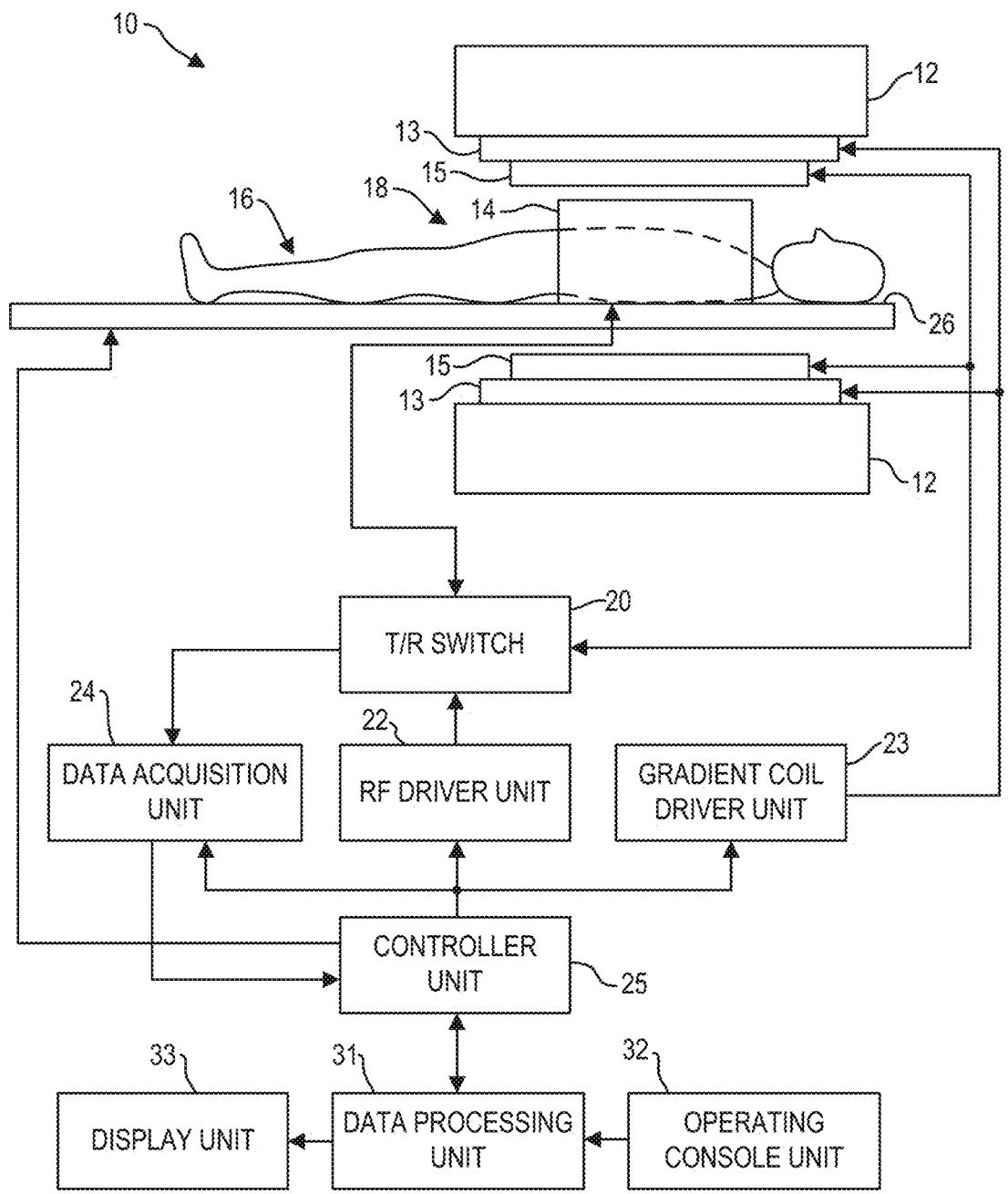
FIG. 1 is a block diagram of an MRI system according to an exemplary embodiment.
Figure 2:
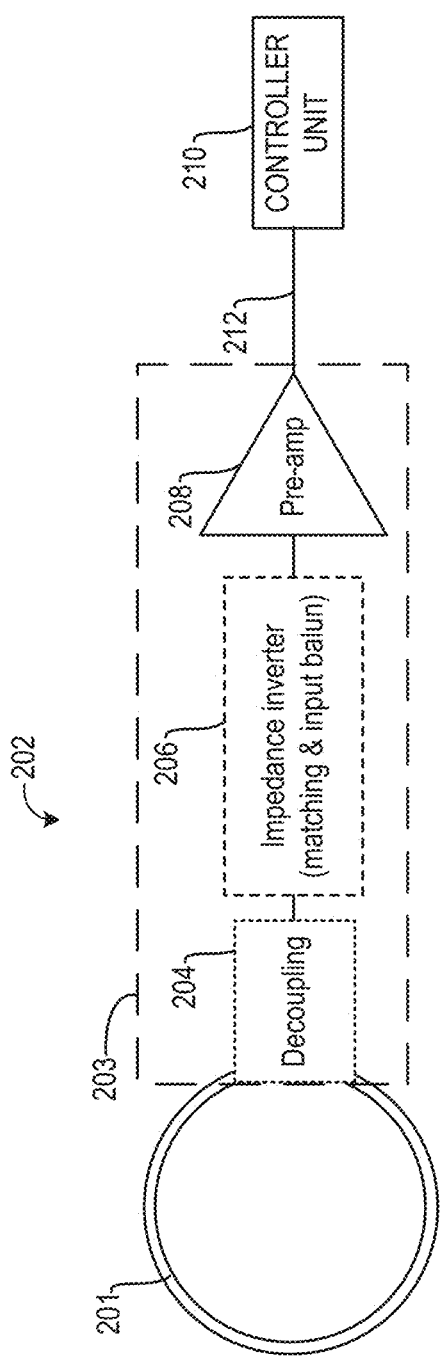
FIG. 2 schematically shows an example RF coil coupled to a controller unit.

FIG. 1 illustrates a magnetic resonance imaging (MM) apparatus 10 that includes a magnetostatic field magnet unit 12, a gradient coil unit 13, an RF coil unit 14, an RF body or volume coil unit 15, a transmit/receive (T/R) switch 20, an RF driver unit 22, a gradient coil driver unit 23, a data acquisition unit 24, a controller unit 25, a patient table or bed 26, a data processing unit 31, an operating console unit 32, and a display unit 33. In some embodiments, the RF coil unit 14 is a surface coil, which is a local coil typically placed proximate to the anatomy of interest of a subject 16. Herein, the RF body coil unit 15 is a transmit coil that transmits RF signals, and the local surface RF coil unit 14 receives the MR signals. As such, the transmit body coil (e.g., RF body coil unit 15) and the surface receive coil (e.g., RF coil unit 14) are separate but electromagnetically coupled components. The MRI apparatus 10 transmits electromagnetic pulse signals to the subject 16 placed in an imaging space 18 with a static magnetic field formed to perform a scan for obtaining magnetic resonance signals from the subject 16. One or more images of the subject 16 can be reconstructed based on the magnetic resonance signals thus obtained by the scan.

The magnetostatic field magnet unit 12 includes, for example, an annular superconducting magnet, which is mounted within a toroidal vacuum vessel. The magnet defines a cylindrical space surrounding the subject 16 and generates a constant primary magnetostatic field $B_0$.

The MM apparatus 10 also includes a gradient coil unit 13 that forms a gradient magnetic field in the imaging space 18 so as to provide the magnetic resonance signals received by the RF coil arrays with three-dimensional positional information. The gradient coil unit 13 includes three gradient coil systems, each of which generates a gradient magnetic field along one of three spatial axes perpendicular to each other, and generates a gradient field in each of a frequency encoding direction, a phase encoding direction, and a slice selection direction in accordance with the imaging condition. More specifically, the gradient coil unit 13 applies a gradient field in the slice selection direction (or scan direction) of the subject 16, to select the slice; and the RF body coil unit 15 or the local RF coil arrays may transmit an RF pulse to a selected slice of the subject 16. The gradient coil unit 13 also applies a gradient field in the phase encoding direction of the subject 16 to phase encode the magnetic resonance signals from the slice excited by the RF pulse. The gradient coil unit 13 then applies a gradient field in the frequency encoding direction of the subject 16 to frequency encode the magnetic resonance signals from the slice excited by the RF pulse.

The RF coil unit 14 is disposed, for example, to enclose the region to be imaged of the subject 16. In some examples, the RF coil unit 14 may be referred to as the surface coil or the receive coil. In the static magnetic field space or imaging space 18 where a static magnetic field $B_0$ is formed by the magnetostatic field magnet unit 12, the RF coil unit 15 transmits, based on a control signal from the controller unit 25, an RF pulse that is an electromagnet wave to the subject 16 and thereby generates a high-frequency magnetic field $B_1$. This excites a spin of protons in the slice to be imaged of the subject 16. The RF coil unit 14 receives, as a magnetic resonance signal, the electromagnetic wave generated when the proton spin thus excited in the slice to be imaged of the subject 16 returns into alignment with the initial magnetization vector. In some embodiments, the RF coil unit 14 may transmit the RF pulse and receive the MR signal. In other embodiments, the RF coil unit 14 may only be used for receiving the MR signals, but not transmitting the RF pulse.

The RF body coil unit 15 is disposed, for example, to enclose the imaging space 18, and produces RF magnetic field pulses orthogonal to the main magnetic field $B_0$ produced by the magnetostatic field magnet unit 12 within the imaging space 18 to excite the nuclei. In contrast to the RF coil unit 14, which may be disconnected from the MRI apparatus 10 and replaced with another RF coil unit, the RF body coil unit 15 is fixedly attached and connected to the MRI apparatus 10. Furthermore, whereas local coils such as the RF coil unit 14 can transmit to or receive signals from only a localized region of the subject 16, the RF body coil unit 15 generally has a larger coverage area. The RF body coil unit 15 may be used to transmit or receive signals to the whole body of the subject 16, for example. Using receive-only local coils and transmit body coils provides a uniform RF excitation and good image uniformity at the expense of high RF power deposited in the subject. For a transmit-receive local coil, the local coil provides the RF excitation to the region of interest and receives the MR signal, thereby decreasing the RF power deposited in the subject. It should be appreciated that the particular use of the RF coil unit 14 and/or the RF body coil unit 15 depends on the imaging application.

The T/R switch 20 can selectively electrically connect the RF body coil unit 15 to the data acquisition unit 24 when operating in receive mode, and to the RF driver unit 22 when operating in transmit mode. Similarly, the T/R switch 20 can selectively electrically connect the RF coil unit 14 to the data acquisition unit 24 when the RF coil unit 14 operates in receive mode, and to the RF driver unit 22 when operating in transmit mode. When the RF coil unit 14 and the RF body coil unit 15 are both used in a single scan, for example if the RF coil unit 14 is configured to receive MR signals and the RF body coil unit 15 is configured to transmit RF signals, then the T/R switch 20 may direct control signals from the RF driver unit 22 to the RF body coil unit 15 while directing received MR signals from the RF coil unit 14 to the data acquisition unit 24. The coils of the RF body coil unit 15 may be configured to operate in a transmit-only mode or a transmit-receive mode. The coils of the local RF coil unit 14 may be configured to operate in a transmit-receive mode or a receive-only mode.

The RF driver unit 22 includes a gate modulator (not shown), an RF power amplifier (not shown), and an RF oscillator (not shown) that are used to drive the RF coils (e.g., RF coil unit 15) and form a high-frequency magnetic field in the imaging space 18. The RF driver unit 22 modulates, based on a control signal from the controller unit 25 and using the gate modulator, the RF signal received from the RF oscillator into a signal of predetermined timing having a predetermined envelope. The RF signal modulated by the gate modulator is amplified by the RF power amplifier and then output to the RF coil unit 15.

The gradient coil driver unit 23 drives the gradient coil unit 13 based on a control signal from the controller unit 25 and thereby generates a gradient magnetic field in the imaging space 18. The gradient coil driver unit 23 includes three systems of driver circuits (not shown) corresponding to the three gradient coil systems included in the gradient coil unit 13.

The data acquisition unit 24 includes a pre-amplifier (not shown), a phase detector (not shown), and an analog/digital converter (not shown) used to acquire the magnetic resonance signals received by the RF coil unit 14. In the data acquisition unit 24, the phase detector phase detects, using the output from the RF oscillator of the RF driver unit 22 as a reference signal, the magnetic resonance signals received from the RF coil unit 14 and amplified by the pre-amplifier, and outputs the phase-detected analog magnetic resonance signals to the analog/digital converter for conversion into digital signals. The digital signals thus obtained are output to the data processing unit 31.

The MRI apparatus 10 includes a table 26 for placing the subject 16 thereon. The subject 16 may be moved inside and outside the imaging space 18 by moving the table 26 based on control signals from the controller unit 25.

The controller unit 25 includes a computer and a recording medium on which a program to be executed by the computer is recorded. The program when executed by the computer causes various parts of the apparatus to carry out operations corresponding to pre-determined scanning. The recording medium may comprise, for example, a ROM, flexible disk, hard disk, optical disk, magneto-optical disk, CD-ROM, or non-volatile memory card. The controller unit 25 is connected to the operating console unit 32 and processes the operation signals input to the operating console unit 32 and furthermore controls the table 26, RF driver unit 22, gradient coil driver unit 23, and data acquisition unit 24 by outputting control signals to them. The controller unit 25 also controls, to obtain a desired image, the data processing unit 31 and the display unit 33 based on operation signals received from the operating console unit 32.

The operating console unit 32 includes user input devices such as a touchscreen, keyboard and a mouse. The operating console unit 32 is used by an operator, for example, to input such data as an imaging protocol and to set a region where an imaging sequence is to be executed. The data about the imaging protocol and the imaging sequence execution region are output to the controller unit 25.

The data processing unit 31 includes a computer and a recording medium on which a program to be executed by the computer to perform predetermined data processing is recorded. The data processing unit 31 is connected to the controller unit 25 and performs data processing based on control signals received from the controller unit 25. The data processing unit 31 is also connected to the data acquisition unit 24 and generates spectrum data by applying various image processing operations to the magnetic resonance signals output from the data acquisition unit 24.

The display unit 33 includes a display device and displays an image on the display screen of the display device based on control signals received from the controller unit 25. The display unit 33 displays, for example, an image regarding an input item about which the operator inputs operation data from the operating console unit 32. The display unit 33 also displays a two-dimensional (2D) slice image or three-dimensional (3D) image of the subject 16 generated by the data processing unit 31.

During a scan, RF coil array interfacing cables (not shown in FIG. 1) may be used to transmit signals between the RF coils (e.g., RF coil unit 14 and RF body coil unit 15) and other aspects of the processing system (e.g., data acquisition unit 24, controller unit 25, and so on), for example to control the RF coils and/or to receive information from the RF coils. As explained previously, the RF body coil unit 15 is a transmit coil that transmits RF signals, and the local surface RF coil unit 14 receives the MR signals. More generally, RF coils are used to transmit RF excitation signals ("transmit coil"), and to receive the MR signals emitted by an imaging subject ("receive coil"). In some embodiments, the transmit and receive coils are a single mechanical and electrical structure or array of structures, with transmit/receive mode switchable by auxiliary circuitry. In other examples, the transmit body coil (e.g., RF body coil unit 15) and the surface receive coil (e.g., RF coil unit 14) may be separate components. For enhanced image quality, however, it may be desirable to provide a receive coil that is mechanically and electrically isolated from the transmit coil. In such case it is desirable that the receive coil, in its receive mode, be electromagnetically coupled to and resonant with an RF "echo" that is stimulated by the transmit coil. However, during transmit mode, it may be desirable that the receive coil is electromagnetically decoupled from and therefore not resonant with the transmit coil, during actual transmission of the RF signal. Such decoupling averts a potential problem of noise produced within the auxiliary circuitry when the receive coil couples to the full power of the RF signal. Additional details regarding the uncoupling of the receive RF coil will be described below.

Turning now to FIG. 2, a schematic view of an RF coil 202 coupled to a controller unit 210 is shown according to an exemplary embodiment. The RF coil 202 includes a loop portion 201 and a coupling electronics portion 203 which is coupled to the controller unit 210 via a coil-interfacing cable 212. In some embodiments, the RF coil may be a surface receive coil, which may be single- or multi-channel. The RF coil 202 may be used in RF coil unit 14 of FIG. 1 and as such may operate at one or more frequencies in the MRI apparatus 10. The coil-interfacing cable 212 may extend between the electronics portion 203 and an interfacing connector of an RF coil array and/or between the interfacing connector of the RF coil array and the MM system controller unit 210. The controller unit 210 may correspond to and/or be associated with the data processing unit 31 and/or controller unit 25 in FIG. 1.

The coupling electronics portion 203 is connected to the loop portion 201 of the RF coil 202. Herein, the coupling electronics portion 203 may include a decoupling circuit 204, impedance inverter circuit 206, and a pre-amplifier 208. The decoupling circuit 204 may effectively decouple the RF coil during a transmit operation. Typically, the RF coil 202 in its receive mode may receive MR signals from a body of a subject being imaged by the MR apparatus. If the RF coil 202 is not used for transmission, then it may be decoupled from the RF body coil while the RF body coil is transmitting the RF signal.

The impedance inverter circuit 206 may include an impedance matching network between the loop portion 201 and the pre-amplifier 208. The impedance inverter circuit 206 is configured to transform an impedance of the loop portion 201 into an optimal source impedance for the pre-amplifier 208. The impedance inverter circuit 206 may include an impedance matching network and an input balun. The pre-amplifier 208 receives MR signals from the loop portion 201 and amplifies the received MR signals. In one example, the pre-amplifier 208 may have a low input impedance configured to accommodate a relatively high blocking or source impedance. Additional details regarding the loop portion and associated coupling electronics portion will be explained in more detail below with respect to FIG. 3. The coupling electronics portion 203 may be packaged in a very small PCB, e.g., approximately 2 cm$^2$ in size or smaller. The PCB may be protected with a conformal coating or an encapsulating resin.

The coil-interfacing cable 212, such as a RF coil array interfacing cable, may be used to transmit signals between the RF coils and other aspects of the processing system. The RF coil array interfacing cable may be disposed within the bore or imaging space of the MRI apparatus (such as MM apparatus 10 of FIG. 1) and subjected to electro-magnetic fields produced and used by the MM apparatus. In MM systems, coil-interfacing cables, such as coil-interfacing cable 212, may support transmitter-driven common-mode currents, which may in turn create field distortions and/or unpredictable heating of components. Typically, common-mode currents are blocked by using baluns. Baluns or common-mode traps provide high common-mode impedances, which in turn reduces the effect of transmitter-driven currents. Thus, coil-interfacing cable 212 may include one or more baluns. In some embodiments, the one or more baluns may be continuous baluns, such as distributed, flutter, and/or butterfly baluns.

FIG. 3 is a schematic diagram of an RF coil 301 in accordance with an exemplary embodiment. RF coil 301 is a non-limiting example of RF coil 202 of FIG. 2 which includes loop portion 201 and coupling electronics portion 203 formed on a feed board 304 (i.e., the platform board). The feed board 304 can be coupled to the coil-interfacing cable 212. In the illustrated embodiment, the loop portion 201 includes a first conductor 300 and a second conductor

302. The first and second conductors 300, 302 may be continuous as shown, or segmented such that the conductors form an open circuit (e.g., form a monopole). The segments of the conductors 300, 302 may have different lengths. The length of the first and second conductors 300, 302 may be varied to achieve a select distributed capacitance, and accordingly, a select resonance frequency.

The first conductor 300 includes a first end 312 terminating to the feed board 304 through a capacitor for direct current (DC) blocking and a second end 316 terminating to the feed board 304 through a first diode 352. The second conductor 302 includes a first end 320 terminating to the feed board 304 through a second diode 354 and a second end 324 terminating to the feed board 304 through a capacitor for DC blocking. The first and second diodes 352 and 354 are part of a decoupling circuit, which will be discussed in detail below.

In the illustrated embodiment, the first and second conductors 300, 302 are each shaped into a circle that terminates to the feed board 304. But in other embodiments, other shapes are possible. For example, the loop portion may be a polygon, shaped to conform the contours of a surface (e.g., housing), and/or the like. The loop portion may also include loops of varying gauge of stranded or solid conductor wire, loops of varying diameters with varying lengths of the first and second conductors 300, 302, and/or loops of varying spacing between the first and second conductors. For example, each of the first and second conductors may have no cuts or gaps (no segmented conductors) or one or more cuts or gaps (segmented conductors) at various locations along the conductive pathway.

The first and second conductors 300, 302 form a distributed capacitance along the length of the loop portion (e.g., along the length of the first and second conductors 300, 302). In the example shown in FIG. 3, the first and second conductors 300, 302 exhibit a substantially uniform capacitance along the entire length of the loop portion. Distributed capacitance (DCAP), as used herein, represents a capacitance exhibited between conductors that distributes along the length of the conductors and may be void of discrete or lumped capacitive components and discrete or lumped inductive components. The DCAP can also be called incorporated capacitance. In some embodiments, the capacitance may distribute in a uniform manner along the length of the conductors.

A dielectric material 303 encapsulates and separates the first and second conductors 300, 302. The dielectric material 303 may be selected to achieve a desired distributive capacitance. For example, the dielectric material 303 may be selected based on a desired permittivity E. In particular, the dielectric material 303 may be air, rubber, plastic, or any other appropriate dielectric material. In some embodiments, the dielectric material may be polytetrafluoroethylene (pTFE). The dielectric material 303 may surround the parallel conductive elements of the first and second conductors 300, 302. Alternatively, the first and second conductors 300, 302 may be twisted upon one another to from a twisted pair cable. As another example, the dielectric material 303 may be a plastic material. The first and second conductors 300, 302 may form a coaxial structure in which the plastic dielectric material 303 separates the first and second conductors. As another example, the first and second conductors may be configured as planar strips.

In the illustrated embodiment, the coupling electronics portion 203 formed on the feed board is coupled to the coil-interfacing cable 212 through a signal interface 328. The signal interface 328 may transmit and/or receive signals via the cable 212. The cable 212 may be a 3-conductor triaxial cable having a center conductor, an inner shield, and an outer shield. In some embodiments, the center conductor is connected to the RF signal and pre-amp control (RF), the inner shield is connected to ground (GND), and the outer shield is connected to the multi-control bias (diode decoupling control) (MC_BIAS).

As explained above with respect to FIG. 2, the coupling electronics portion 203 includes a decoupling circuit, impedance inverter circuit, and pre-amplifier. Conventionally, the decoupling circuit is coupled to the loop portion through separate lead wires and may be formed on a separate decoupling board from the feed board. The decoupling board may include, for example, resonance circuits and PIN diodes, microelectromechanical systems (MEMS) switches, or another type of switching circuitry. However, mounting the decoupling board on the loop reduces reliability and flexibility of the coil. The decoupling circuit as disclosed herein uses components on the feed board and avoids utilization of separate lead wires and a separate decoupling board. In particular, the decoupling circuit in the present disclosure may include a decoupling diode 330 and a decoupling interface 350 which includes the first diode 352 at one end of the first conductor 300, the second diode 354 at one end of the second conductor 302, and an inductor 356 between the end of the first conductor 300 and the end of the second conductor 302, all of which can be formed on the feed board 304. The decoupling diode 330 may be provided with voltage from MC_BIAS in order to turn decoupling diode 330 on during, for example, a transmit operation. When on, decoupling diode 330 causes first conductor 300 to short with second conductor 302, thus decoupling the distributed capacitance of the loop portion 201 from the feed board 304. In some embodiments, only one of the first and second diodes 352 and 354 is used.

In operation, decoupling diode 330 is turned on to decouple the RF coil 301 during a transmit operation. In particular, the decoupling diode 330 may be provided with voltage from MC_BIAS in order to turn decoupling diode 330 on during a transmit operation. The decoupling circuit may further include a capacitor 333, inductor 331, diode 384, and capacitor 388, as shown in FIG. 3. The voltage from MC_BIAS is also provided to the decoupling interface 350 in order to short (e.g., turn on) first diode 352 and second diode 354. For example, when voltage is supplied from MC_BIAS, current may flow from line 358, through second inductor 360 (RF blocking inductor), through second diode 354, through inductor 356 (RF blocking inductor), and through first diode 352. When first diode 352 and second diode 354 are shorted, the current flowing in loop portion 201 reduces further (e.g., relative to when only decoupling diode 330 is shorted), thereby virtually eliminating the capacitance in the loop portion 201. With the capacitance removed, the loop portion becomes an inductor, in series with the decoupling circuit of the coupling electronics portion 203, adding positive reactance to the RF coil. The increased reactance decreases the current in the loop portion 201 and adds a phase shift between the excitation voltage and the impressed current, resulting in decreased Joule power (thus lowering the heat generated by the RF coil) and decreasing $B_1$ field distortion.

The impedance inverter circuit includes matching circuitry and an input balun. The input balun may be a lattice balun that comprises two inductors (inductor 370 and inductor 372) and two capacitors (capacitor 374 and capacitor 376). The matching circuitry may include capacitor 378, inductor 380, and capacitor 382. In some embodiments, the impedance inverter circuit includes diode 386 to block RF receive signals from proceeding into decoupling bias branch (MC_BIAS).

The pre-amplifier 332 may be a low input impedance pre-amplifier optimized for high source impedance by the impedance inverter circuitry. The pre-amplifier may have a low noise reflection coefficient, y, and a low noise resistance, Rn. With the pre-amplifier having the appropriate y and Rn values, the pre-amplifier provides a blocking impedance for RF coil 301 while also providing a large noise circle in the context of a Smith Chart. As such, current in RF coil 301 is minimized, the pre-amplifier is effectively noise matched with loop portion 201 output impedance. Having a large noise circle, the pre-amplifier yields an effective SNR over a variety of loop portion impedances while producing a high blocking impedance.

The RF coil presented above with respect to FIGS. 2 and 3 may be utilized in order to receive MR signals during an MR imaging session. As such, the RF coil of FIGS. 2 and 3 may be used in RF coil unit 14 of FIG. 1 and may be coupled to a downstream component of the MRI system, such as the controller unit 25. The RF coil may be placed in the bore of the MM system in order to receive the MR signals during the imaging session, and thus may be in proximity to the transmit RF coil (e.g., the body RF coil unit 15 of FIG. 1). The controller unit may store instructions in non-transitory memory that are executable to generate an image from an imaging subject positioned in the bore of the MRI system during an MR imaging session. To generate the image, the controller unit may store instructions to perform a transmit phase of the MR imaging session. During the transmit phase, the controller unit may command (e.g., send signals) to activate the transmit RF coil(s) in order to transmit one or more RF pulses. To prevent interference leading to $B_1$ field distortion during the transmit phase, the receive RF coil(s) may be decoupled during the transmit phase. The controller unit may command (e.g., send signals) to decouple the receive RF coil(s) by supplying voltage from the MC_BIAS to the decoupling interface as well as the decoupling diode of the coupling electronics. The controller unit may store instructions executable to perform a subsequent receive phase of the MR imaging session. During the receive phase, the controller unit may obtain MR signals from the receive RF coil(s). The MR signals are usable to reconstruct the image of the imaging subject positioned in the bore of the MM system. During the receive phase, the diodes of the decoupling interface as well as the decoupling diode of the coupling electronics portion may be turned off.

The coupling electronics portion 203 shown in FIG. 3 is exemplary, and other coupling electronics configurations are possible. In some embodiments the decoupling interface 350 is positioned on the feed board 304. In some embodiments, only one of the first and second diodes 352 and 354 is used.

Figure 4:
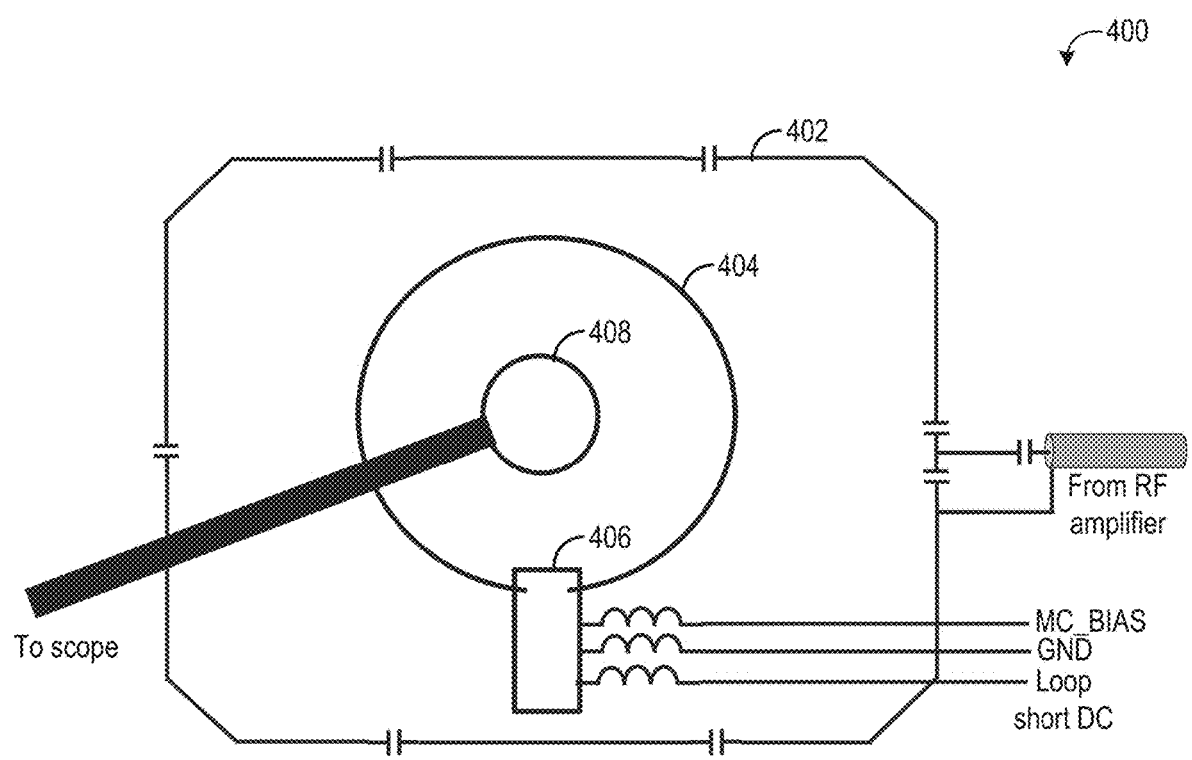
FIG. 4 shows an example test set-up for measuring a temperature of an RF coil.
Figure 5:
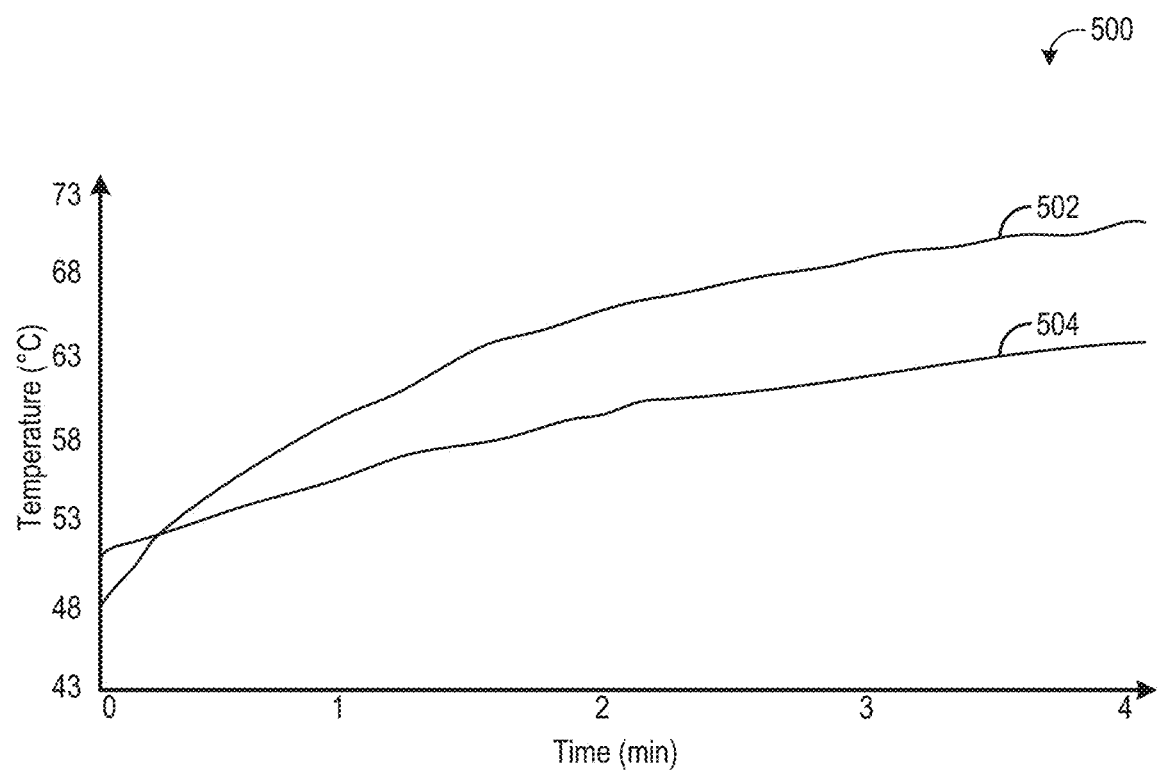
FIG. 5 shows an example graph of RF coil temperature as measured with the test set-up of FIG. 4.

FIG. 4 shows a schematic diagram 400 of an example test set-up for measuring a temperature of an RF coil according to an embodiment of the disclosure. The test set-up includes a transmit RF coil 402, a receive RF coil 404 including a feed board 406, and a wire loop 408. The temperature of the receive RF coil 404 may be monitored during a transmit operation, where power is supplied to the transmit RF coil 402 from an RF amplifier. The power may be applied to the transmit RF coil 402 from the RF amplifier at a suitable duty cycle (e.g., 6% duty cycle). The power from the RF amplifier is also supplied to the receive RF coil in order to decouple the receive RF coil from the transmit RF coil 402. The wire loop 408 may be present to control the field strength of the resultant magnetic field. The feed board 406 may be coupled to a triaxial cable including an MC_BIAS line, ground line, and loop short DC line. The loop short DC line may be the same as MC_BIAS, but used separately for the test to compare the results with and without this feature.

The test set-up may include an IR camera (not shown) to measure the temperature of the feed board 406, for example. The test set-up may be used to measure a temperature of an RF coil that includes an additional decoupling interface, such as the RF coil 301 of FIG. 3. Thus, in an example, the RF coil 404 may be RF coil 301. The test set-up may also be used to measure the temperature of an RF coil that does not include the additional decoupling interface, such as a control RF coil that includes a decoupling diode on its feed board but does not include additional components of the decoupling circuit.

FIG. 5 shows a graph 500 of RF coil temperature as a function of time as measured using the test set-up described above with respect to FIG. 4. Graph 500 includes time (in minutes) plotted along the x-axis and temperature (in ° C.) plotted along the y-axis. Graph 500 includes two curves. A first curve 502 illustrates temperature as a function of time for a first RF coil that does not include a decoupling interface between the loop portion and coupling electronics portion. For example, the first RF coil may include a decoupling diode (e.g., diode 330) but may not include additional components of the decoupling circuit. A second curve 504 illustrates temperature as a function of time for a second RF coil that does include the decoupling interface, such as the RF coil 301 described above with respect to FIG. 3. The temperature data obtained to generate curves 502 and 504 was obtained while power was supplied to decouple each RF coil. In other words, voltage was supplied (e.g., via respective MC_BIAS lines) to the decoupling circuit of the coupling electronics portion (for both curve 502 and curve 504) as well as the decoupling interface (for curve 504) in order to turn on all the decoupling diodes. The measured temperatures may be the temperature of each coupling electronics portion (e.g., the temperature of each feed board) as determined from output from an IR camera positioned to image a top side of each feed board. The measured temperature may be an average temperature of the entire top of the feed board, or the measured temperature may be the temperature of a specific component or region of the feed board that is prone to heating during transmit operation, such as the inductor of the lattice balun of the coupling electronics.

As appreciated by FIG. 5, at time 0 and shortly thereafter, both RF coils are at similar temperatures (e.g., both curves are around 53° C. just after time 0). As time progresses and each RF coil increases in temperature, the second RF coil that includes the decoupling interface (represented by curve 504) increases in temperature less quickly than the first RF coil that does not include the decoupling interface (represented by curve 502). By time 4 minutes, the first RF coil is at a temperature of approximately 68° C. while the second RF coil is at a temperature of approximately 63° C. Overall, by including the additional decoupling diodes in the decoupling interface, the second RF coil may operate at a temperature that is significantly lower than the first RF coil that does not include the additional decoupling diodes of the decoupling interface. Due to the lower temperature, the second RF coil may operate more reliably. Further, heat spreaders on the feed board may be dispensed with, if desired, lowering component cost and size.

The RF coil described herein (such as RF coil 301) may be included in an RF coil array, such as the example RF coil array 610 of FIG. 6. RF coil array 610 is shown as including four RF coils, but any array configuration is possible, such as 8, 16, 32 (or any appropriate number of) RF coils. Each RF coil of RF coil array 610 includes a loop portion and feed board, such as loop portion 612 and feed board 614. Each feed board may include a decoupling circuit, an impedance inverter circuit, and a pre-amplifier as shown in FIGS. 2 and 3.

Each feed board may be coupled to a downstream MRI system component (e.g., controller unit and/or data acquisition unit) via a coil-interfacing cable. Each coil interfacing cable may include at least one balun. The data acquisition unit may be configured to output information acquired by the RF coil array 610 to a data processing unit that is configured to generate an image from the information.

Accordingly, RF coil array 610 includes four coil loops, four feed boards, and four coil-interfacing cables. For example, a first RF coil of RF coil array 610 may include a first coil loop 612, a first feed board 614, and a first coil-interfacing cable 616. In some examples, the coil-interfacing cables may be bundled together in a single grouping of four coil-interfacing cables, which may be referred to as an integrated balun cable harness.

A technical effect of including a decoupling interface comprising a set of diodes and a set of inductors between a distributed capacitance loop portion and a coupling electronics portion of an RF coil is that less heat may be generated during transmit operation due to increased reactance, which may add a phase shift between the excitation voltage and impressed current, thereby lowering heating of the RF coil. Another technical effect is that the diodes may be provided on the ends of the loop portion and supplied with current (e.g., to turn on the diodes to remove capacitance from the loop portion, lower current in the loop portion, and increase the reactance) from a source already present on the coupling electronics portion, minimizing the componentry required for decoupling and lowering the temperature of the RF coil. A further technical effect of positioning the decoupling interface (e.g., the set of diodes and set of inductors) at the ends of the wires of the loop portion is that increased decoupling and reduced heating of the RF coil may be provided with a variety of different feed board configurations.

As used herein, an element or step recited in the singular and proceeded with the word "a" or "an" should be understood as not excluding plural of said elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising," "including," or "having" an element or a plurality of elements having a particular property may include additional such elements not having that property. The terms "including" and "in which" are used as the plain-language equivalents of the respective terms "comprising" and "wherein." Moreover, the terms "first," "second," and "third," etc. are used merely as labels, and are not intended to impose numerical requirements or a particular positional order on their objects.

This written description uses examples to disclose the invention, including the best mode, and also to enable a person of ordinary skill in the relevant art to practice the invention, including making and using any devices or systems and performing any incorporated methods. The patentable scope of the invention is defined by the claims, and may include other examples that occur to those of ordinary skill in the art. Such other examples are intended to be within the scope of the claims if they have structural elements that do not differ from the literal language of the claims, or if they include equivalent structural elements with insubstantial differences from the literal languages of the claims.

The invention claimed is:

1. A radio frequency (RF) coil assembly for a magnetic resonance imaging (MRI) system, comprising:
   a loop portion with distributed capacitance which comprises two conductor wires encapsulated and separated by a dielectric material, the distributed capacitance including a capacitance between the two conductor wires that distributes along a length of the two conductor wires; and
   a feed board comprising:
      a decoupling circuit configured to decouple the distributed capacitance of the loop portion during a transmit operation;
      an impedance inverter circuit; and
      a pre-amplifier;
      wherein the decoupling circuit comprises a first diode coupled to an end of a first wire of the two conductor wires, a second diode coupled to an end of a second wire of the two conductor wires, and an inductor between the end of the first wire and the end of the second wire.

2. The RF coil assembly of claim 1, wherein the first diode and the second diode are turned on by applying a voltage during the transmit operation of the MRI system.

3. The RF coil assembly of claim 1, wherein the decoupling circuit comprises a diode coupled to an end of a first wire of the two conductor wires, and an inductor between the end of the first wire and an end of the second wire.

4. The RF coil assembly of claim 1, wherein the impedance inverter circuit comprises an impedance matching network and an input balun, wherein the pre-amplifier comprises a low input impedance pre-amplifier for high source impedance, and wherein the impedance matching network provides the high source impedance.

5. The RF coil assembly of claim 1, wherein the loop portion is void of any capacitive lumped components along an entire length of the loop portion between terminating ends thereof.

6. The RF coil assembly of claim 1, wherein the feed board further comprises an interface for connecting to a data acquisition unit of the MRI system via a coil-interfacing cable, the data acquisition unit configured to output information acquired by the RF coil assembly to a data processing unit that is configured to generate an image from the information.

7. The RF coil assembly of claim 1, wherein the two conductor wires are parallel to each other, and wherein the dielectric material comprises polytetrafluoroethylene, rubber, or plastic.

8. A radio frequency (RF) coil assembly for a magnetic resonance imaging (MRI) system comprising an array of RF coils, wherein each RF coil comprises:
   a loop portion with distributed capacitance which comprises two conductor wires encapsulated and separated by a dielectric material; and
   a feed board, a respective end of each of the two conductor wires terminating into the feed board, the feed board comprising:
      a decoupling circuit configured to decouple the distributed capacitance of the loop portion during a transmit operation;
      an impedance inverter circuit; and
      a pre-amplifier;

wherein the impedance inverter circuit comprises an impedance matching network and an input balun, wherein the pre-amplifier comprises a low input impedance pre-amplifier for high source impedance, and wherein the impedance matching network provides the high source impedance.

9. The RF coil assembly of claim 8, wherein the decoupling circuit comprises a diode coupled to an end of a first wire of the two conductor wires, and an inductor between the end of the first wire and an end of the second wire.

10. The RF coil assembly of claim 8, wherein the loop portion is void of any capacitive lumped components along an entire length of the loop portion between terminating ends thereof.

11. The RF coil assembly of claim 8, wherein the decoupling circuit comprises a first diode coupled to an end of a first wire of the two conductor wires, a second diode coupled to an end of a second wire of the two conductor wires, and an inductor between the end of the first wire and the end of the second wire.

12. The RF coil assembly of claim 11, wherein the first diode and the second diode are turned on by applying a voltage during the transmit operation of the MRI system.

13. A method for a receive radio frequency (RF) coil for a magnetic resonance imaging (MRI) system, the method comprising:

forming a loop portion with distributed capacitance comprising two conductor wires encapsulated and separated by a dielectric material;

coupling a first diode to an end of a first wire of the two conductor wires;

coupling an inductor between the end of the first wire and an end of a second wire of the two conductor wires; and turning on the first diode to decouple the distributed capacitance of the loop portion during a transmit operation of the MRI system.

14. The method of claim 13, further comprising:
coupling a second diode to the end of the second wire; and
turning on the second diode during the transmit operation of the MRI system.

15. The method of claim 13, further comprising turning off the first diode during a receive operation of the MRI system and receiving magnetic resonance (MR) signals via the loop portion, the MR signals usable to reconstruct an image of an imaging subject positioned within a bore of the MRI system.

16. The method of claim 13, further comprising coupling the loop portion to an impedance inverter circuit.

17. The method of claim 16, further comprising coupling the impedance inverter circuit to a pre-amplifier.

18. The method of claim 17, wherein the first diode, the inductor, the impedance inverter circuit, and the pre-amplifier are formed on one feed board.

* * * * *